United States Patent
Cooper et al.

(10) Patent No.: US 6,900,142 B2
(45) Date of Patent: May 31, 2005

(54) INHIBITION OF TIN OXIDE FORMATION IN LEAD FREE INTERCONNECT FORMATION

(75) Inventors: Emanual I. Cooper, Scarsdale, NY (US); John M. Cotte, New Fairfield, CT (US); Lisa A. Fanti, Hopewell Junction, NY (US); David E. Eichstadt, Noth Salem, NY (US); Stephen J. Kilpatrick, Lagrangeville, NY (US); Henry A. Nye, III, Brookfield, CT (US); Donna S. Zupanski-Nielsen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,560

(22) Filed: Jul. 30, 2003

(65) Prior Publication Data

US 2005/0026450 A1  Feb. 3, 2005

(51) Int. Cl.$^7$ ............................................. H01L 21/461
(52) U.S. Cl. ..................... 438/747; 257/736; 252/79.1
(58) Field of Search ................. 252/79.1–79.5; 257/736, 764; 438/747, 704, 614, 656

(56) References Cited

U.S. PATENT DOCUMENTS

| | | | |
|---|---|---|---|
| 5,462,638 A | 10/1995 | Datta et al. | |
| 5,462,891 A | * 10/1995 | Okada | ........................ 438/669 |
| 5,536,388 A | 7/1996 | Dinan et al. | |
| 5,543,032 A | 8/1996 | Datta et al. | |
| 5,614,076 A | 3/1997 | Brophy et al. | |
| 5,759,437 A | * 6/1998 | Datta et al. | ................ 252/79.1 |
| 5,800,726 A | 9/1998 | Cotte et al. | |
| 5,930,597 A | 7/1999 | Call et al. | |
| 5,938,856 A | 8/1999 | Sachdev et al. | |
| 6,103,096 A | 8/2000 | Datta et al. | |
| 6,261,426 B1 | 7/2001 | Uzoh et al. | |
| 6,468,413 B1 | 10/2002 | Fanti et al. | |

* cited by examiner

*Primary Examiner*—Matthew Smith
*Assistant Examiner*—Calvin Lee
(74) *Attorney, Agent, or Firm*—DeLio & Peterson, LLC; John J. Tomaszewski; James J. Cioffi

(57) ABSTRACT

A method is provided for removing exposed seed layers in the fabrication of solder interconnects on electronic components such as semiconductor wafers without damaging the interconnects or underlying wafer substrate and with a high wafer yield. The solder interconnects are lead free or substantially lead free and typically contain Sn. An oxalic acid solution is used to contact the wafer after an etching step to remove part of the seed layer. The seed layer is typically a Cu containing layer with a lower barrier layer containing barrier metals such as Ti, Ta and W. The lower barrier layer remains after the etch and the oxalic acid solution inhibits the formation of Sn compounds on the barrier layer surface which compounds may mask the barrier layer and the barrier layer etchant resulting in incomplete barrier layer removal on the wafer surface. Any residual conductive barrier layer can cause shorts and other wafer problems and result in a lower wafer yield. An electroetch is preferred to remove the portion of the seed layer overlying the lower barrier layer.

9 Claims, 2 Drawing Sheets

INHIBITION OF TIN OXIDE FORMATION IN LEAD FREE INTERCONNECT FORMATION

BACKGROUND OF INVENTION

1. Field of the Invention

The present invention relates to semiconductor devices and other electronic components and, more particularly, to the use of tin containing lead free and reduced lead solder interconnects in the devices and to the removal of adherent metal layers used in the interconnect fabrication process without damaging the solder interconnects or the underlying component structure and with a high electronic component yield.

2. Description of Related Art

C4 is an advanced microelectronic chip packaging and connection technology. "C4" stands for Controlled Collapse Chip Connection. C4 is also known as "solder bump", "solder balls" and "flip chip" and these terms may also be used in conjunction such as "C4 solder bump".

The basic idea of C4 is to connect chips (semiconductor devices), chip packages, or such other electronic component units by means of solder bumps between two surfaces of the units. These tiny bumps of electrically conductive solder bridge the gaps between respective pairs of metal pads on the units being connected. Each pad has a corresponding pad on the other unit's surface; the pad arrangements are mirror images. As the units are pressed together and heated the solder bumps on the pads of the first unit are contacted with corresponding conductive pads (having no bumps) on the second unit and reflowed, partially collapsing the solder bumps and making connections between respective pads.

In C4 the solder bumps are formed directly on the metal pads of the one unit. The pads are electrically isolated from other components by the insulating substrate that surrounds each pad. The substrate might be silicon (Si) or some other material. The bottom of the pad is electrically connected into the chip circuit and a major application of C4 is in joining chips to a carrier or package.

One method of forming solder bumps uses sputtering or vacuum deposition. In this method, solder metal is evaporated in a vacuum chamber. The metal vapor coats everything in the chamber with a thin film of the evaporated metal. To form solder bumps on the substrate, the vapor is allowed to pass through holes in a metal mask held over the substrate. The solder vapor passing through the holes condenses onto the cool surface into solder bumps.

An alternative technique for making solder bumps is electrodeposition, also called electrochemical plating or electroplating. This method also uses a mask and forms solder bumps only at the selected sites, but the technique is very different from the evaporation method.

The first step in electrolytically forming C4 solder bumps is to deposit a continuous stack of metal films across the wafer to be bumped. This so-called "seed layer" performs a dual function. First, it provides a conductive path for current flow during the electrolytic deposition of the solder bumps. Second, it remains under the solder bumps and forms the basis for the ball limiting metallurgy (BLM) for the C4s. Therefore, it must contain at least one layer that is conductive enough to permit uniform electrodeposition across the entire expanse of the wafer. The bottom layer must adhere well to the underlying semiconductor device passivation and the top layer must interact sufficiently with the solder to form a reliable bond. In addition, the BLM may contain barrier layers which prevent the solder from detrimentally interacting with the underlying device constituents. Finally, the stresses generated by the composite stack should be low enough to sustain the reliability of the C4 joint throughout various thermal and mechanical stresses. Considering all of these factors, seed layers often consist of more than one metal layer, and these various layers must be etched away from between the C4s at some point during the processing in order to electrically isolate the interconnects.

The second step, after the seed layer is laid down, is to form a mask by photolithography. A layer of photoresist is laid onto the seed layer and exposed to light. The mask has rows of holes where the solder bumps are to be deposited.

The third step is electrodeposition (electroplating) of solder into the mask holes.

After the solder bumps are formed, the mask of cured photoresist is removed. The substrate now is covered with the continuous seed layer and numerous solder bumps. Then, the seed layer is removed in between the solder bumps to electrically isolate them by suitable wet etching and/or electroetching processes.

The solder typically used for the C4 solder bumps is 95–97 weight percent Pb and 3–5 weight percent Sn. A typical seed layer could comprise a lower barrier layer containing Ti or Ta such as TiW, a phased Cr/Cu layer or a Cr/Cu alloy and an upper Cu layer. The process utilized to simultaneously remove the Cr/Cu and Cu layers is typically an electroetching process which includes an aqueous solution containing glycerol, potassium phosphate and potassium sulfate as disclosed in U.S. Pat. No. 6,468,413, which patent is hereby incorporated by reference. The lower barrier layer is then etched using a wet etching process which includes an aqueous etchant as also disclosed in U.S. Pat. No. 6,468,413.

More recent applications use a lower melting solder for the C4 bumps to enable lower temperature chip joining. Such a lower melting solder could be the lead/tin solder composition comprising 63 weight percent Sn and 37 weight percent Pb.

Cotte et al. U.S. Pat. No. 5,800,726, the disclosure of which is incorporated by reference herein, have proposed an aqueous solution for the wet etching of various metals, such as TiW, in the presence of eutectic solder. This solution comprises potassium phosphate, hydrogen peroxide, EDTA and oxalic acid.

There is also a growing need to use lead free and reduced lead solder interconnects and these solders typically employ Sn and small concentrations of one or more other metals such as Ag, Cu and Bi. These solders are especially high in tin, containing 95–99% Sn. Seed layer removal with high Sn solders is more difficult than the standard lead solders (such as 97/3 Pb/Sn). For example, in a typical seed layer such as TiW/Cu/Cr/Cu, when using an electroetch to remove the Cu/Cr/Cu seed layers, this highly oxidizing environment promotes the formation of Sn oxides and other Sn compounds near the solder bump and over the TiW underlying surface. The Sn oxide masks the underlying layer leaving a conductive residue between the interconnects. This affects the yield of the interconnection fabrication process since residual metal between the interconnects may cause shorting and other related failures in the device.

Bearing in mind the problems and deficiencies of the prior art it is an object of the present invention to provide an effective and high yield method to remove the seed layer during the interconnect fabrication process used to make electronic components such as semiconductors without damaging the interconnects and underlying electronic component substrate.

A further object of the invention is to provide an effective and high yield method to remove the seed layer during the interconnect fabrication process when using lead free and reduced lead solder interconnects, especially high tin solders, without damaging the interconnects and underlying electronic component substrate.

Another object of the present invention is to provide an effective and high yield method to remove the seed layer during the interconnect fabrication process using an electroetch process to remove seed layers overlying a barrier sublayer such as TiW without damaging the interconnects and underlying substrate.

These and other purposes of the present invention will become more apparent from the following description considered in conjunction with the following drawings.

SUMMARY OF INVENTION

The above and other objects and advantages, which will be apparent to one of skill in the art, are achieved in the present invention which is directed to, in a first aspect, a method for removing exposed seed layer in the fabrication of solder interconnects on electronic components such as semiconductors comprising the steps of:

providing an electronic component having a plurality of spaced apart solder interconnects formed on a seed layer, the seed layer extending in the spaces between the solder interconnects and being exposed and the seed layer comprising a plurality of layers including a lower barrier layer; removing the exposed layers above the lower barrier layer preferably using an etchant; rinsing the electronic component;

contacting the rinsed component with an oxalic acid solution while the electronic component is still wet; and removing the exposed lower barrier layer preferably using an etchant.

In another aspect a method is provided for removing exposed seed layer in the fabrication of solder interconnects on electronic components such as semiconductors comprising the steps of:

providing an electronic component having a plurality of spaced apart solder interconnects formed on a seed layer, the seed layer extending in the spaces between the solder interconnects and being exposed and the seed layer comprising a plurality of layers including a lower barrier layer such as a TiW layer and typically an intermediate adhesion and stress compensation layer such as a Cr/Cu layer and an upper Cu layer; removing the exposed layers above the lower barrier layer preferably using an etchant; rinsing the electronic component;

contacting the rinsed component with an oxalic acid solution while the electronic component is still wet; and removing the exposed lower barrier layer preferably using an etchant.

In another aspect of the invention the seed layer comprises a lower TiW layer, an intermediate Cr/Cu layer and an upper Cu layer on which the solder interconnect is formed. A nickel layer may be used on the Cu layer and then the solder interconnect formed on the nickel layer.

In a further aspect of the invention the seed layers, e.g., a Cr/Cu layer and Cu layer of the seed layer above the lower TiW layer, are removed using an electroetch process.

BRIEF DESCRIPTION OF DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

While the following description will be directed for convenience to a BLM comprising a TiW lower barrier layer, a Cu/Cr intermediate adhesion and stress compensation layer and a Cu layer, it will be appreciated by those skilled in the art that the invention is applicable to other BLM's and other seed layers.

Figure 1:
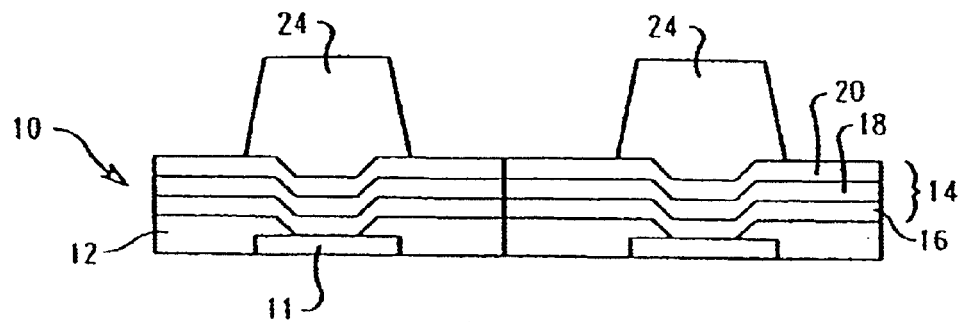
FIG. 1 is a side view of a chip showing the seed layer and a solder comprising primarily Sn.

Referring to the drawings in more detail, and particularly referring to FIG. 1, there is shown a first chip 10 comprised of a pad 11, semiconductor material 12, seed layer shown in composite as numeral 14 and solder bumps (or interconnects) 24. As noted earlier, the seed layer 14 is actually comprised of a plurality of layers. One typical grouping of layers, for purposes of illustration and not limitation, is first lower layer 16 of a TiW alloy (e.g., 10 weight percent Ti and 90 weight percent Tungsten), second layer 18 of phased Cr/Cu or a Cr/Cu alloy and third upper layer 20 of Cu. Chip 10 is fabricated using conventional techniques such as applying the seed layer by sputtering, applying a photoresist, imaging and developing, and then forming the solder interconnect by plating.

The solder bump 24 on chip 10 comprises a Sn containing solder. Such a solder might be of moderate Sn content such as 60 weight percent or more Sn and 40 weight percent or less Pb, or high Sn content such as 95 weight percent or greater of Sn, balance Pb. Too, the solder may include lead-free alloys comprising primarily Sn such as Sn/Ag, Sn/Cu, Sn/Ag/Cu, and Sn/Bi alloys, just to name a few. Any suitable tin containing solder can be used in the invention.

Figure 2:
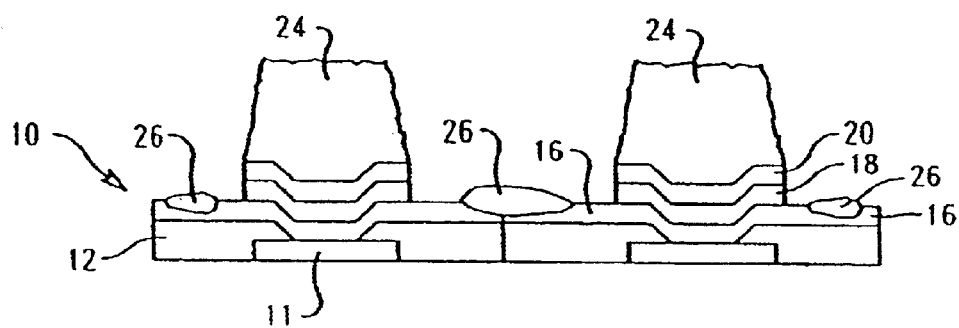
FIG. 2 is a side view of the chip in FIG. 1 after electroetching with a prior art etchant.

Referring now to FIG. 2, chip 10 has been conventionally electroetched with a conventional aqueous etchant including glycerol, potassium phosphate and potassium sulfate. The composition of this etchant was 0.1 M $K_3PO_4$, 0.3 M $K_2SO_4$ and 1.5 M glycerol.

As can be seen from FIG. 2, solder interconnect 24 has been attacked during electroetching, resulting in a jagged edge and Sn loss. Moreover, some of the Sn from the solder 24 has been redeposited onto first (lower) layer 16 of the seed layer and may even chemically bond with it and is shown as numeral 26. It is hypothesized that the Sn of the solder is oxidized to a $Sn^{+4}$ state because of the electroetch. Phosphates in the electrolyte may form water insoluble tin compounds such as $SnHPO_4$, $Sn_3(PO_4)_4$ and $Sn(HPO)_2$.

Any remaining $SN^{+4}$ can form hydrated stannic oxide. If not removed these tin compounds 26 can mask the underlying TiW layer.

Figure 3:
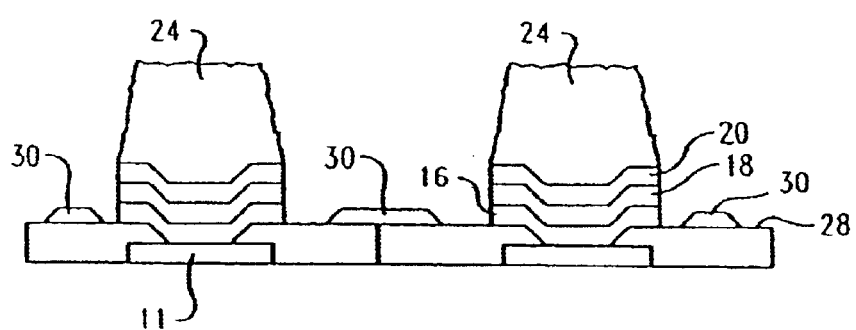
FIG. 3 is a side view of the chip in FIG. 2 after wet etching to remove the last layer of the seed layer.
Figure 4:
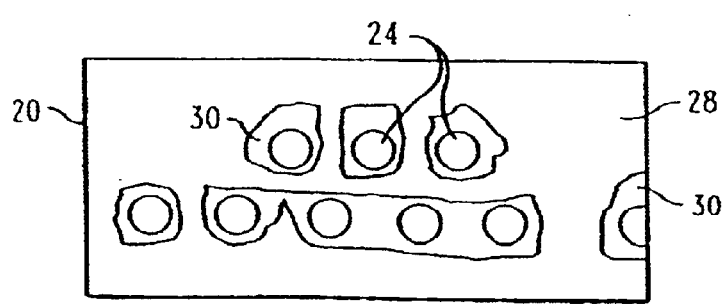
FIG. 4 is an illustration of the surface of the chip in FIG. 3 showing incomplete etching of the seed layer.

Subsequently, the chip 10 was wet etched in a conventional TiW aqueous etchant as disclosed in U.S. Pat. No. 5,462,638, the disclosure of which is incorporated herein by reference. The results after wet etching are illustrated in FIGS. 3 and 4 where it can be seen that the first layer 16 has been substantially removed leaving surface 28 of the chip 20 mostly devoid of the first layer 16. However, Sn deposits 26 (as shown in FIG. 2) prevented the etching of some areas of first layer 16, thereby leaving areas 30 of the first layer 16 which were not etched away.

A chip structure such as that shown in FIG. 3 is undesirable and can result in high yield loss. FIG. 4 shows unetched lower layer 30 which can cause shorts and other problems with the component.

Figure 5:
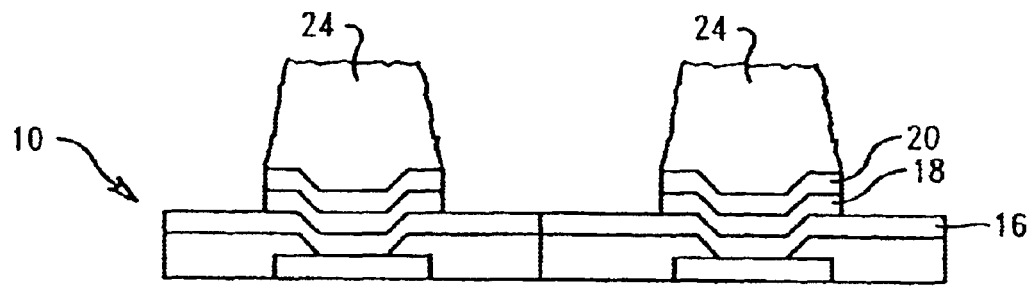
FIG. 5 is a side view of the chip in FIG. 1 after electroetching and contacting with the oxalic acid solution according to the present invention.

Referring now to FIG. 5, chip 10 of FIG. 1 was electroetched with an aqueous etchant as in FIG. 2 but after a minimum 3.5 minute rinse, was then contacted while still wet with an oxalic acid solution according to the present invention. The rinse used a bath of 7.3% by weight oxalic acid. In general, the oxalic acid concentration can vary, by weight %, from 0.1% to saturation, preferably 1% to 10%, and most preferably 6% to 8%. Comparing FIG. 5 to FIG. 2, it can be seen that there are no Sn areas 26 which could mask the lower layer 16 and the lower layer etchant.

Figure 6:
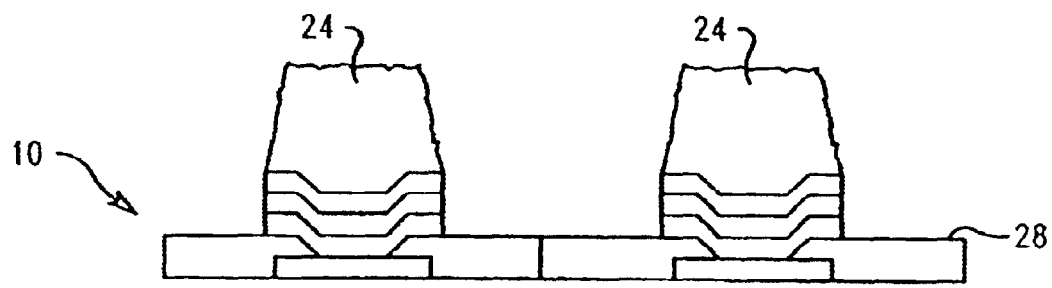
FIG. 6 is a side view of the chip in FIG. 5 after wet etching to remove the last layer of the seed layer.
Figure 7:
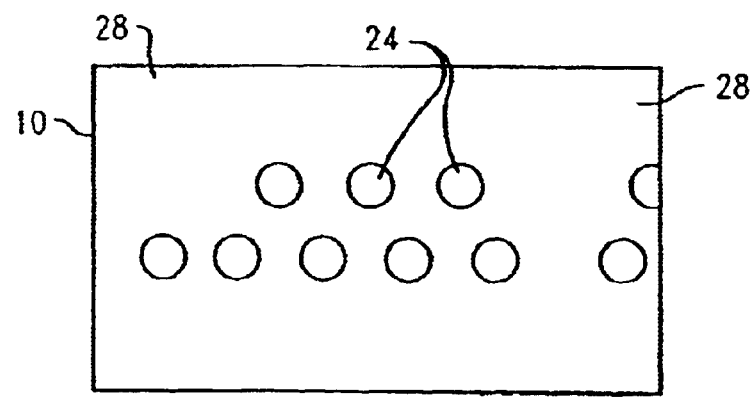
FIG. 7 is an illustration of the surface of the chip in FIG. 6 showing complete etching of the seed layer.

Chip 10 was then wet etched in a conventional TiW aqueous etchant as in U.S. Pat. No. 5,462,638, supra. The results are illustrated in FIGS. 6 and 7 where it can be seen that the first lower TiW layer 16 has been entirely removed leaving surface 28 of the chip 10 devoid of any residue.

The use of the present invention has been found to greatly increase the electronic component yield from the electroetching and lower layer TiW etching processes.

The predominant method of removing the seed layers above the lower TiW layer is electroetch. The electroetch process is very well known (for example as disclosed in U.S. Pat. Nos. 5,543,032; 5,614,076; and 6,103,096; which patents are hereby incorporated by reference) and there are basically two types, the vertical electroetch (VEET) and the horizontal electroetch process (HEET). The etch processes are different in the conformation of the tool. In the case of the VEET tool the wafer sits vertically in the tool while the nozzle delivering electrolyte moves up and down over the surface of the wafer. In the HEET tool, the wafer sits horizontally with the nozzle spraying up onto the wafer as it moves across delivering the electrolyte.

While the following is specifically directed to the use of the electroetch process to remove the seed layer, it will be appreciated by those skilled in the art that other such etching methods may be used to practice the invention.

In general, for tin rich solders, the HEET process has been found to be preferred. The use of the oxalic acid solution has been found to be very effective in preventing Sn oxide and other Sn residues from becoming attached to the lower barrier surface and this effect is obtained for both VEET and HEET processes.

In practicing the invention, it is preferred that rinses be performed between each of the seed removal etching steps to obtain the best results. The length of the rinse (and type of rinse) is sufficient to remove chemicals and reaction products on the wafer surface. It has been found further that the order of contacting the etched wafer with the oxalic acid solution is also very important. It is highly preferred that the oxalic acid solution is contacted with the electroetched substrate after the electroetch process and a rinse while the wafer is still wet.

It is conventional to use a methane sulfonic acid (MSA) clean in lead solder processing and such a clean may be used in conjunction with the oxalic acid clean of the invention. Acids other than MSA which may be used include tetrafluoroboric acid and trifluoroacetic acid. It may be possible to combine the oxalic acid and MSA clean bath for certain applications.

Experimental results have indicated a dramatic difference between the use of an MSA treatment and oxalic acid treatment with the use of oxalic acid clearly providing a higher yield of commercially acceptable wafers.

It has also been found that the order of oxalic acid and MSA cleaners is also important for reducing TiW residues and it is highly preferred that the oxalic acid clean be performed first and be performed while the wafer is still wet from the electroetch process. In general, when using an oxalic acid clean followed by an MSA clean the % of good wafers was over 95% using the HEET process. In comparison, if the MSA clean is performed before the oxalic acid clean, the % of good wafers are 75–90%. This is still a dramatic increase in yield over the conventional process which does not use an oxalic acid clean.

The length of time the wafer is in the oxalic acid bath or contacted with the bath has been found to have a relatively small effect on the percentage of good wafers. However, it is preferred that the length of time be at least about 3–5, e.g., 10 minutes or more, since the longer time produces less TiW (seed layer) anomalies which may have an effect on wafer yield. A seed layer anomaly may be defined as any conducting material that has the potential of shorting C4's to each other.

It is preferred to prepare the oxalic acid solution using the acid although any suitable salt can be used. The wafer can be immersed in the oxalic acid in a container of any configuration preferably with mild agitation. A spray can also be used.

While oxalic acid is the preferred treating material, other suitable organic acids such as saturated aliphatic dicarboxylic acids and substituted saturated aliphatic dicarboxylic acids and derivatives thereof such as choranilic acid and squaric acid may be employed. A salt of the acid may be used.

When an MSA treatment is performed it is preferred to use a 50% weight MSA solution and to soak the wafer in a tray containing the MSA solution with the C4 bumps side up. After the oxalic acid and the MSA procedures are performed and the TiW layer is removed, the electronic component is ready to be reflowed to form the solder interconnect in the form of a solder bump as is well known in the art.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for removing exposed seed layer in the fabrication of solder interconnects on electronic components such as semiconductors comprising the steps of:

providing an electronic component having a plurality of spaced apart solder interconnects formed on a seed layer, the seed layer extending in the spaces between the solder interconnects and being exposed and the seed layer comprising a plurality of layers including a lower layer;

removing the exposed layers above the lower layer using an etchant;

rinsing the electronic component;

contacting the rinsed component with an oxalic acid solution while the electronic component is still wet; and removing the exposed lower layer using an etchant.

2. The method of claim 1 wherein the solder interconnects are made from a solder containing tin.

3. The method of claim 2 wherein the seed layer comprises a lower TiW layer, an intermediate Cu/Cr layer and an upper Cu layer.

4. The method of claim 3 wherein the intermediate Cu/Cr layer and upper Cu layer are removed using an electroetch process.

5. The method of claim 4 wherein after contacting with the oxalic acid solution and rinsing, the rinsed electronic component is contacted with a methane sulfonic acid solution and rinsed before removing the lower TiW layer.

6. The method of claim 4 wherein after rinsing the electronic component after the first etch, the rinsed component is contacted with a methane sulfonic acid solution before contacting with an oxalic acid solution.

7. The method of claim 4 wherein the electroetch process is a horizontal process.

8. The method of claim 4 wherein the electroetch process is a vertical process.

9. The method of claim 1 wherein the solder interconnects are made from a lead free or substantially lead free solder containing Sn.

* * * * *